United States Patent [19]

Moen et al.

[11] 4,264,807
[45] Apr. 28, 1981

[54] COUNTER INCLUDING TWO 2 BIT COUNTER SEGMENTS CONNECTED IN CASCADE EACH COUNTING IN GRAY CODE

[75] Inventors: David N. Moen; George C. Thomas, both of Rochester, Minn.

[73] Assignee: International Business Machines Corporation, Armonk, N.Y.

[21] Appl. No.: 28,146

[22] Filed: Apr. 9, 1979

[51] Int. Cl.³ ............................................ H03K 23/08
[52] U.S. Cl. ....................... 235/92 GD; 235/92 GT; 235/92 SH
[58] Field of Search ........ 235/92 GD, 92 CC, 92 SH, 235/92 MB, 92 GT; 328/37, 41; 307/220 R, 221 R

[56] References Cited

U.S. PATENT DOCUMENTS 3,209,347  9/1965  Cutaia ............................ 235/92 GD
3,515,341  6/1970  Frick ............................. 235/92 GD

*Primary Examiner*—Joseph M. Thesz
*Attorney, Agent, or Firm*—Keith T. Bleuer

[57] ABSTRACT

An electrical counter including a pair of counter segments connected in cascade. Each of the counter segments has a capacity of two bits and counts in Gray code of 00, 01, 11, 10 and 00 on succeeding pulses to be counted which are applied onto the segment. The second segment includes an AND circuit which is satisfied when the count of the preceding segment is 10 so as to GATE the pulse supplied at that time on to the second segment so that the second segment has its value changed at the same time as the first segment has its value changed from 10 to 00.

8 Claims, 8 Drawing Figures

COUNTER INCLUDING TWO 2 BIT COUNTER SEGMENTS CONNECTED IN CASCADE EACH COUNTING IN GRAY CODE

BACKGROUND OF THE INVENTION

The invention relates to electrical counters and more particularly to those that count in other than binary code.

Previous electrical counters (for counting a series of electrical pulses applied to them) have generally counted in binary code of 00, 01, 10, 11 and 00 (for a 2 bit counter) on succeeding pulses to be counted by the counter. If more than one such 2 bit counter is utilized for providing a successive change in value of a succeeding counter stage, so that the value 100 may be registered for example, it is necessary that the outputs of the two latches or memory devices in the first stage holding the values of 11 shall be ANDed together for the purpose. When more than three values of count, such as for a count of 110100, etc. are needed, the outputs of all of the previous latches must be ANDed together at the same time for the purpose. This has led to a complexity of circuitry.

SUMMARY OF THE INVENTION

It is an object of the present invention to provide improved counting circuitry whereby only one counting pulse from a previous stage or segment of a counter need be supplied to a succeeding stage or segment in order to cause the counter to count with all of the succeeding count values desired.

In a preferred form of the invention, the counter includes two counter segments each having a 2 bit content. Each of the counter segments is arranged so that it counts in the Gray code of 00, 01, 11, 10 and 00 in which there is only one bit change at a time in the two bits of each segment. Thus in order to provide a first new bit condition in a succeeding segment, it is only necessary at the same time to change the count of one of the bit latches or memories of the first segment when the bit change in the segment occurs. Thus for two 2 bit segments, a change in the overall count of the counter may occur from the count value of 0010 to 0100. This arrangement provides a reduced complexity of circuitry.

DESCRIPTION OF THE PREFERRED EMBODIMENT

Figure 1A:
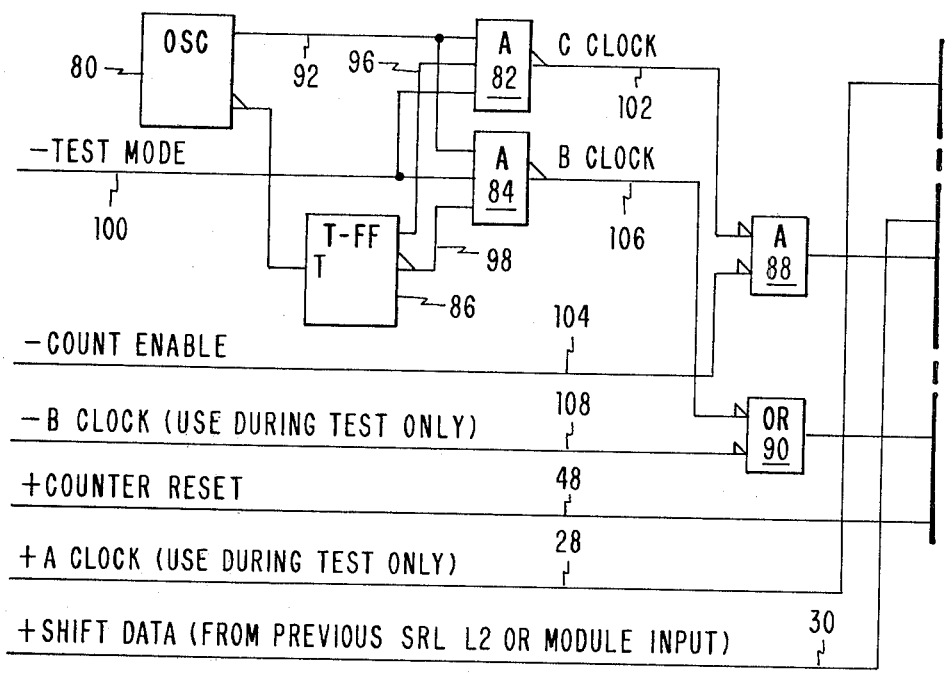
FIG. 1A shows driving circuitry for the counter.
Figure 1:
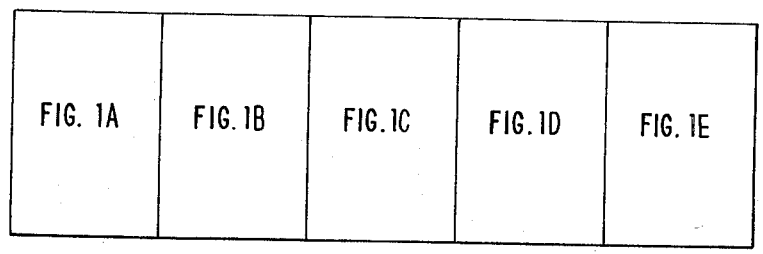
FIG. 1 is a chart showing how FIGS. 1A–1E shall be placed together in order to form a complete showing of the counter with its driving circuitry.
Figure 1B:
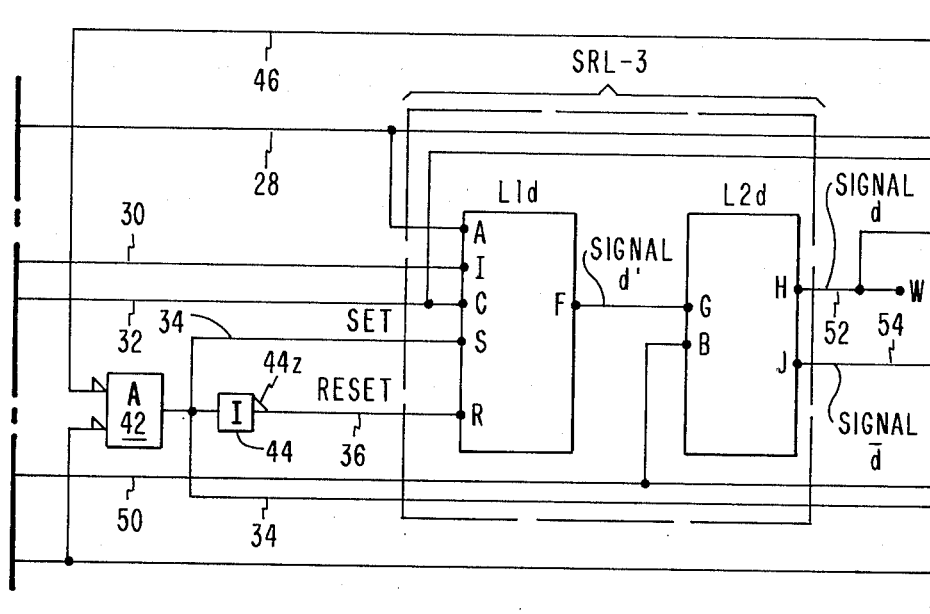
FIGS. 1B, 1C, 1D and 1E show parts of the counter of the invention.
Figure 4:
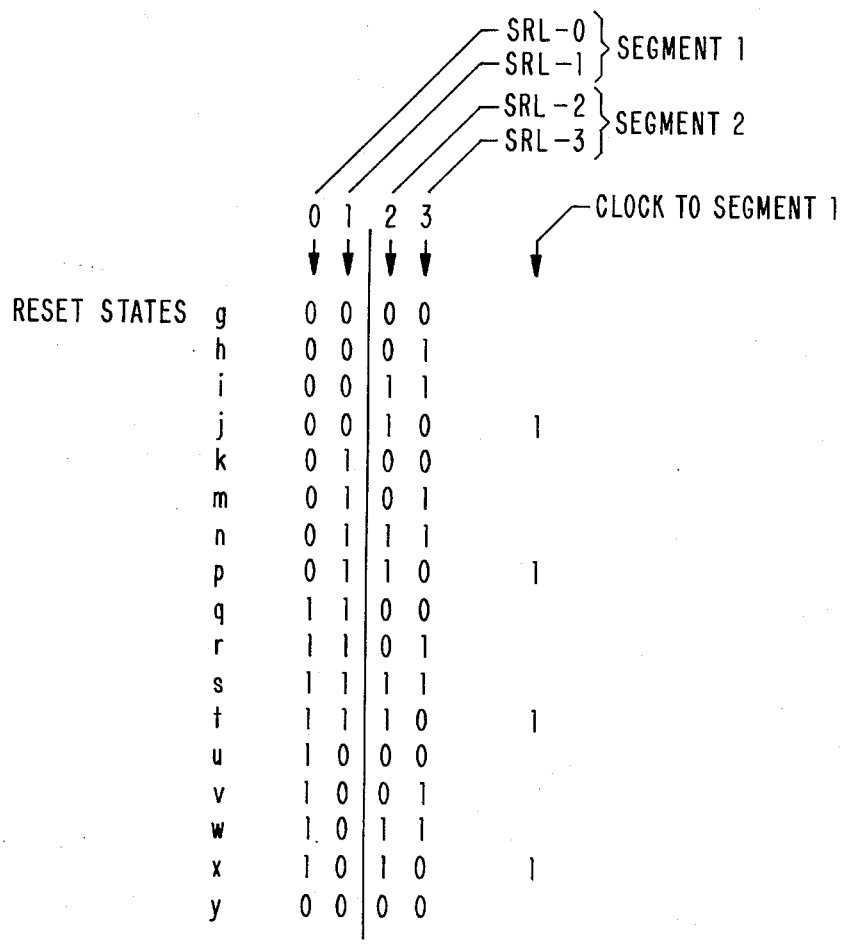
FIG. 4 is a chart showing the manner in which the value content of the counter of FIGS. 1B–1E changes on succeeding counts of the counter.

The counter of the invention (which is shown particularly in FIGS. 1B–1E) comprises cascaded counter segments. Two such counter segments are shown in FIG. 2, namely counter segment 2 and counter segment 1. These counter segments count as shown in FIG. 4 (each in a "Gray" code as distinguished from a binary code, and with the counts being indicated as the output states on terminals W, X, Y and Z of FIGS. 1B–1E).

Each of the two counter segments includes two latches of the SRL type (the acronym SRL stands for shift register latch), and the SRLs are used as parts of a shift register in test mode, as will be subsequently described. Counter segment 2 includes SRL-3 and SRL-2 shown respectively in FIGS. 1B and 1C, and counter segment 1 includes SRL-1 and SRL-0 shown respectively in FIGS. 1D and 1E. The SRL-3 produces the change of states on its terminal W as shown in column 3 of FIG. 4, while the SRL-2, SRL-1 and SRL-0 respectively produce the change of states shown in columns 2, 1 and 0 above on their terminals X, Y and Z.

The SRL-3 includes latches L2$d$ and L1$d$, and each of the other SRLs include duplicates of these latches. The SRL-2, SRL-1 and the SRL-0 include the latches L2$c$, L2$b$ and L2$a$ which are identical to the latch L2$d$, and include also latches L1$c$, L1$b$ and L1$a$ which are identical to the latch L1$d$.

Each of the L2 latches has the input terminals G and B and the output terminals H and J, and each of the L1 latches has the input terminals A, I, C, S and R and the output terminal F. Each of the L1 latches is of such construction that when a SET signal is applied to the S input terminal, the latch sets when a subsequent CLOCK pulse is applied onto the C terminal. The signal on the F output terminal will then change from an inactive or 0 level to an active or 1 level. The L1 latch is furthermore so constructed so that when a RESET signal is applied onto the R input terminal, the L1 latch will be subsequently reset on the following application of a pulse to the C terminal, thus changing the signal on the output terminal F to 0 from 1. The C, S and R input terminals are thus used in a so called "normal" mode.

The F and G terminals of the L1 and L2 latches respectively are connected together, and the L2 latch is of such construction that whatever value appears on the F terminal is gated into the L2 latch when a pulse subsequently appears on the B terminal of the L2 latch. The signal on the H terminal is a 1 when the L2 latch is set, and the signal on the H terminal is a 0 when the L2 latch is reset. The signals on the J terminal are just inverse of those on the H terminal. Whatever values are so latched into the L2 latch, these remain until the following pulse on the B terminal.

The A and I input terminals to the L1 latch are used only in a so called test mode. In a test mode phase, data is scanned into latches L1 and L2 from the scan data terminal I. When the signal on the terminal I is either a 1 or a 0, this data is latched into the latch L1 upon a following pulse on the A terminal. This data is thus stored into the L1 latch and is apparent on the F terminal. The terminals F and G are connected together, and this data on the F terminal is thus stored in the L2 latch and is effective on the terminals H and J upon the following pulse applied to the B terminal. This data remains in the L2 latch until the existence of a following pulse on the B terminal when the data on the terminals F and G will again be sampled by the L2 latch.

The latch L1$d$ has the input signal lines 28, 30, 32, 34 and 36 applied respectively to its input terminals A, I, C, S and R. These lines respectively carry an A CLOCK signal, a SCAN DATA signal, a GATED C CLOCK signal, a SET signal and a RESET signal as is indicated in FIG. 1B.

An AND circuit 42 provides the SET signal on line 34 as its output, and the line 34 constitutes the input to an inverter 44 which provides the RESET signal on line 36 as its output. It will be noted that the output of the inverter 44 has a "flag" 44z, and this indicates that the level on the output of the inverter is inactive while the input to the inverter is active. The "flags" shown in FIGS. 1A, 1D in connection with other circuits have the same meaning, namely, that either the input or output, as the case may be, of the particular circuit considered is inactive or 0 while the other terminal of the circuit is the inverse when the circuit is satisfied.

The AND circuit 42 has a line 46 and a line 48 as inputs. The line 48 carries a + COUNTER RESET signal applied to it by the operator of the counter, and the origin and the purpose of the signal on the line 46 will be subsequently described. The terminal B of the latch L2d has a line 50 connected to it carrying a B CLOCK signal originated as will be subsequently described. The terminals H and J have inverse signals on them as will be described in greater detail, and these terminals are connected with output lines 52 and 54. The terminal W is applied onto the line 52.

The lines 28 and 32 are applied to the input terminals A and C of the latch L1c as to the latch L1d. The line 52 is connected to the I terminal of the latch L1c, and it provides a SCAN DATA signal to this terminal used only in test mode. A SET signal is applied onto the terminal S of the L1c latch by means of an AND circuit 56 and its output line 58. The AND circuit 56 has the line carrying the + COUNTER RESET signal and the line 54 applied to it as inputs. An inverter 60 has the line 58 as an input and has an output line 62 connected to the R terminal of the latch L1c carrying a RESET signal. The line 58 is also applied as an input to an AND circuit 64, and the output of an inverter 66 is applied by means of its output line 68 as a second input to the AND circuit 64. The inverter 66 has the lead 32 as an input. The line 48 carrying the + COUNTER RESET signal is a third input to the AND circuit 64. The AND circuit 64 provides an output on its output line 70. The output terminals H and J of the latch L2c have inverse signals on them and are respectively connected to output lines 46 and 76. The line 46 is connected to the AND circuit 42 as previously described and has the terminal X connected to it.

Figure 1C:
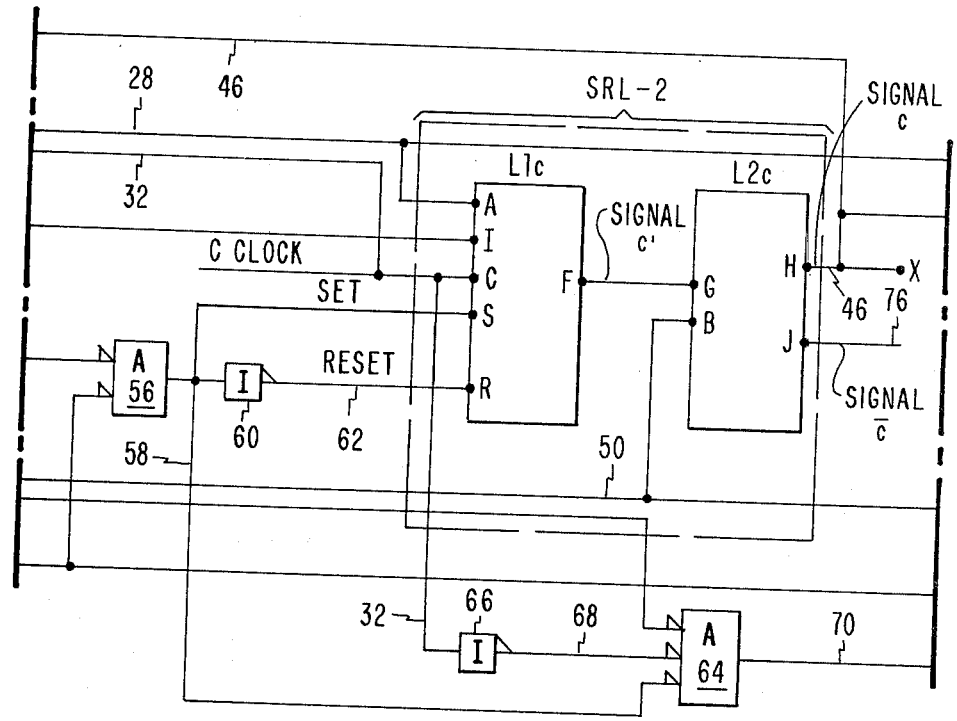
Figure 2:
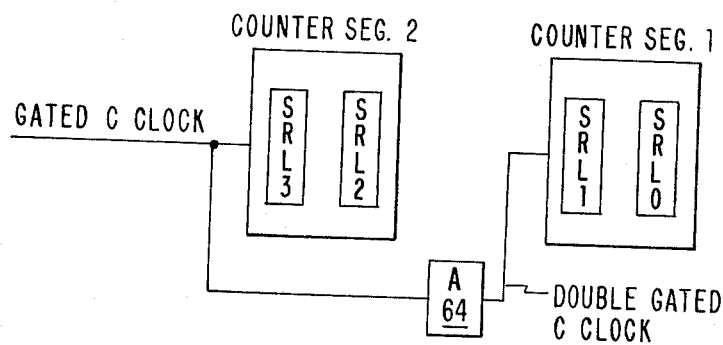
FIG. 2 is a diagrammatic illustration of the counter of FIGS. 1B–1E.
Figure 1D:
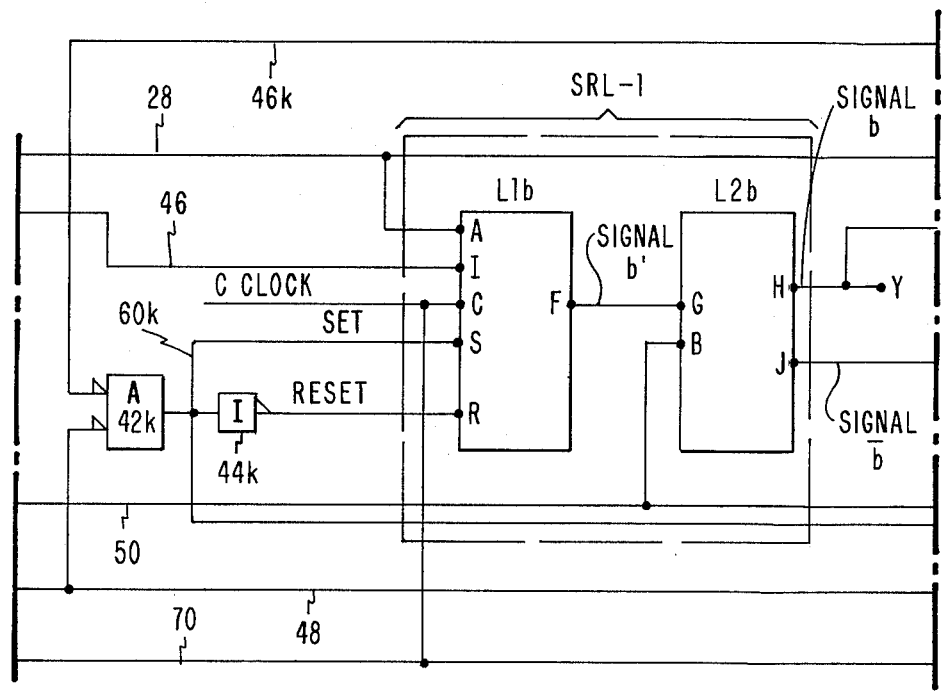
Figure 1E:
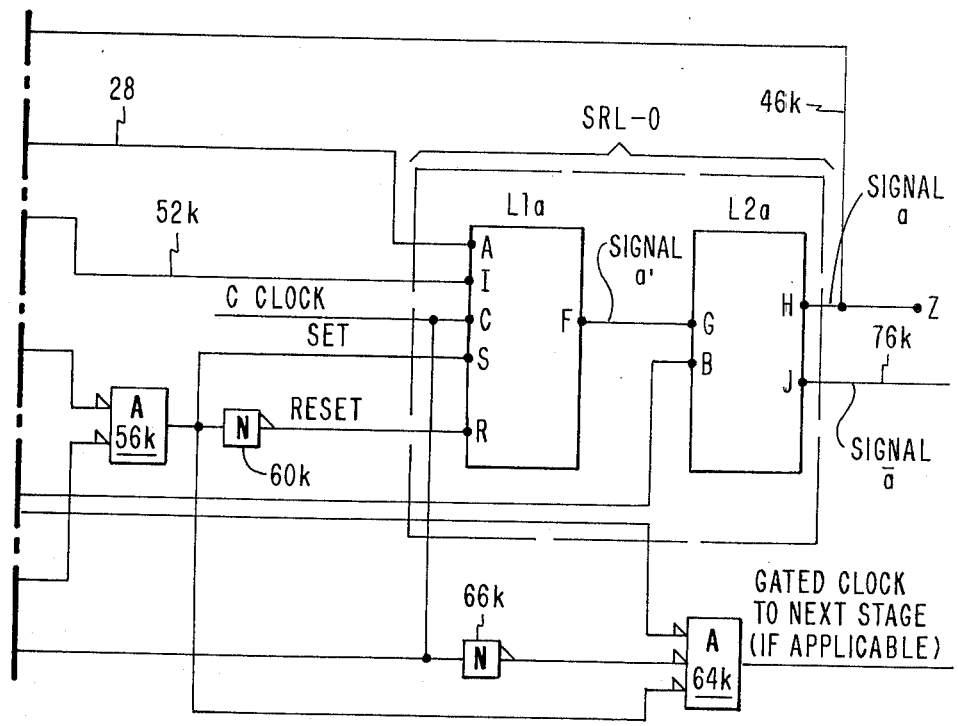

Counter segment 1 which is shown in FIGS. 1D and 1E is identical with the counter segment 2 shown in FIGS. 1B and 1C and just previously described. The parts of counter segment 1 and their connections shown in FIGS. 1D and 1E will therefore not be particularly described except to mention that the parts of counter segment 1 are the same as those of counter segment 2 but with the additional letter character "k" being applied to each of the reference numerals and except to mention that the lines 48, 70, 46 and 28 constitute inputs to the counter segment 1 of FIGS. 1D and 1E. As previously mentioned, the lines 28 and 48 also constitute inputs to parts of counter segment 2. Line 70 carries a DOUBLE GATED C CLOCK signal corresponding to the GATED C CLOCK signal on line 32 but with further gating as will be clear from subsequent description herein, and the line 46 carries a SCAN DATA signal corresponding to that on line 30 applied as an input to counter segment 2.

The outputs of the latch L2b of SRL-1 are on lines 52k and 54k, and the terminal Y is connected with the line 52k. The latch L2a of SRL-0 has the output lines 46k and 76k, and the terminal Z is carried by the line 46k.

The counter pre se is shown in FIGS. 1B–1E and the parts of it may be on a single large scale integration chip. One example of clock generation logic useable in connection with the counter is shown in FIG. 1A, and this may constitute separate circuitry. The FIG. 1A clock generation logic comprises an oscillator 80, AND circuits 82 and 84 driven by the oscillator 80, a trigger type flip flop 86 in particular between the oscillator 80 and AND circuit 84, and AND circuit 88 having the gated C CLOCK line 32 as an output and an OR circuit 90 having the B CLOCK line 50 as an output.

The oscillator 80 has output lines 92 and 94 carrying inverse signals, and the line 92 is applied as inputs to the AND circuits 82 and 84. Line 94 is applied as an input to the trigger type flip flop 86, and the flip flop 86 has the output lines 96 and 98 respectively applied as inputs to the AND circuits 82 and 84. A line 100 carrying the signal − TEST MODE is applied to both of the AND circuits 82 and 84 as inputs. The output line 102 of the AND circuit 82 carries a C CLOCK signal which is applied to the AND circuit 88 as an input, and a line 104 carrying a − COUNT ENABLE signal is applied as a second input to the AND circuit 88. The output line 106 of the AND circuit 84 carries a B CLOCK signal and is applied an an input to the OR circuit 90 which has the B CLOCK signal on line 50 as an output. The OR circuit 90 also has the line 108 carrying a − B CLOCK signal as an input.

Figure 3:
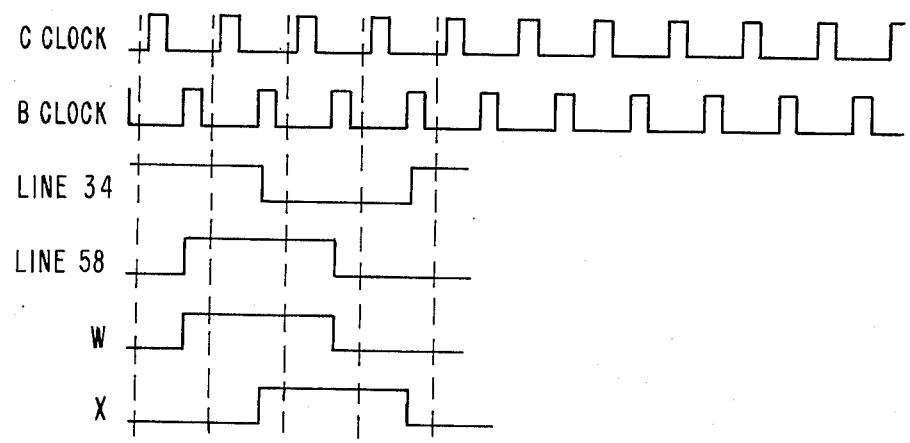
FIG. 3 is a timing diagram showing the manner in which various signals in the counter and driving circuitry of FIGS. 1A–1E vary with time.

In operation, the counter shown in FIGS. 1B–1E functions basically as two two-bit counters each counting in "GRAY" code of 00, 01, 11, 10 and 00 (rather than in binary code of 00, 01, 10, 11, and 00). The counts of segments 1 and 2 and of the counter as a whole are shown as states g–y of FIG. 4. One of the two-bit counters is counter segment 2 including SRL-3 and SRL-2, and the other two-bit counter is counter segment 1 including SRL-1 and SRL-0. The counter of FIGS. 1B–1E counts the C CLOCK pulses on line 102 which are shown in FIG. 3, and the counting occurs in particular when the COUNT ENABLE signal on line 104 is active (when the signal level on line 104 is low). The oscillator 80 generates the C CLOCK pulses constituting a square wave and provides them on its output line 92. The inverse output of the oscillator upon line 94 is applied to the flip flop 86, and the flip flop 86 toggles on the following edge of an oscillator pulse on line 94. The flip flop 86 thus gates either AND circuit 82 or AND circuit 84 to determine the C CLOCK and B CLOCK signals on lines 102 and 106. The B CLOCK and C CLOCK pulses alternate with each other due to the action of the flip flop 86 as is shown in FIG. 3. It is assumed that the clock generation logic is set for operating mode and therefore the signal level on line 100 is up so that the AND circuits 82 and 84 are alternately enabled.

The AND circuit 88 determines when the counter of FIGS. 1B–1E is effective to count the C CLOCK pulses on line 102. When counting is desired, the − COUNT ENABLE signal is effective, and the signal level on line 104 is low so that the C CLOCK pulses on line 102 may be transmitted through AND circuit 88 to line 32 carrying the resultant GATED C CLOCK signal. At this time, the OR circuit 90 is effective to transmit the B CLOCK pulses to line 50. During this ordinary operation, the signals on lines 48, 28 and 108 are at their inactive levels, and the signal on line 30 is ineffective on L1d due to the fact that line 28 is inactive.

The SRL-3 is the least significant bit of the counter of FIGS. 1B–1E, and it toggles first, before the other SRLs, so as to change the 0 in state g in column 3 of the code listed in FIG. 4 to a 1 shown in state h of the code. This change is evident on the terminal W and occurs after the first GATED C CLOCK pulse on the line 32 and on the subsequent B CLOCK pulse on the line 50. The SRL-3 is set if AND circuit 42 is satisfied. This occurs if there is no + COUNTER RESET signal applied to line 48 and if the signal level on line 46, which is an output of the L2c latch of SRL-2 is inactive. Since the counter of FIGS. 1B–1E starts with a 0000 condition shown in state g of the code listed in FIG. 4, the signal level on line 46 is low; and the signal level on line 48 is also low, since the operator does not apply the RESET signal on this line for resetting the counter. The output of AND circuit 42 on line 34 is therefore high, and this is the SET signal applied to the terminal S of the latch L1d. On the subsequent GATED C CLOCK pulse applied to the terminal C of the latch L1d, the latch L1d toggles and produces a high or a 1 output signal d' on the terminal F of this latch. Upon the following B CLOCK signal on line 50, this active or a 1 signal on terminal F is clocked into the latch L2d, and the signal d on line 52 goes high or to a 1. This is indicated by a 1 signal on the terminal W and in column 3, state h, of FIG. 4.

The AND circuit 56 was not satisfied at the first GATED C CLOCK pulse on line 32 because the $\bar{d}$ signal on line 54 was active or at a 1 level. Thus, the inverter 60 at this time has a high level signal on its output line 62 so that the latch L1c remains in its RESET condition with the signal c' being a 0. Likewise, the latch L2c remains in its RESET condition so that the signal c is 0. Thus, at this time the counter segment 2 is in its state 01 shown in state h of the FIG. 4 code.

With the second GATED C CLOCK signal on line 32 from AND circuit 88, the signal c on line 46 is still 0, and the AND circuit 42 therefore is still satisfied providing a continued SET signal on line 34 so that the latch L1d remains in a SET condition providing a 1 signal on d. Inverter 44 thus provides an ineffective level to the R terminal of L1d. The signal $\bar{d}$ changed to a 0 along with the change of the signal d to a 1 as previously described, and AND circuit 56 is thus satisfied. This provides a SET signal on the S terminal of the latch L1c; and, on the second GATED C CLOCK signal on line 32, latch L1c is set so as to provide an active or 1 signal c'. On the following B CLOCK signal on line 50, the 1 signal c' is gated into the latch L2c, setting the latch L2c and providing a 1 or active signal c on line 46 and on terminal X. Therefore, both of the latches L2d and L2c are in SET condition providing a 1 or active signal on both of the terminals W and X, and the counter segment 2 is then in its 11 condition set forth in state i, columns 2 and 3, of FIG. 4.

At the time of the third GATED C CLOCK pulse on line 32, the latch L2c is SET and provides a 1 signal on the line 46. The AND circuit 42 therefore is not satisfied, and inverter 44 thus provides a 1 signal on its output line 36 to the R terminal of the latch L1d. The latch L1d therefore is RESET by the third GATED C CLOCK pulse applied to the terminal C of the latch L1d so that the signal d' is a 0. The latch L2d, however, still remains is SET condition; and the signal $\bar{d}$ on line 54 is a 0. Thus, AND circuit 56 is satisfied so that the latch L1c of SRL-2 remains in SET condition. Thus, at this time, the latch L1d is in RESET condition; the latch L2d is in SET condition; and both of the latches L1c and L2c of SRL-2 are in SET condition.

On the next B CLOCK pulse on line 50, the 0 signal d' is gated into the latch L2d so as to RESET the latch L2d and provide a 0 signal d on line 52 and on terminal W. The B CLOCK pulse is also supplied to the terminal B of the latch L2c; however, since the signal c' is a 1, the latch L2c remains in SET condition to continue to provide a 1 signal c on the terminal X. Thus, the third count of the counter segment 2 has been completed, and counter segment 2 contains the count of 10 shown in state j, columns 2 and 3, of FIG. 4.

At this time, the L2d latch is in RESET condition, and the signal $\bar{d}$ on line 54 is positive. The AND circuit 56 therefore is not satisfied and produces a 0 signal on its output line 58. The signal c on the output line 46 of the latch L2c is at a 1 level, and the AND circuit 42 therefore is not satisfied and produces a 0 signal on its output line 34. Both of these signals are supplied to the AND circuit 64. The AND circuit 64 when enabled provides a DOUBLE GATED C CLOCK signal on line 70 for causing counter segment 1 to count. Prior to this time, counter segment 1 has been and has remained in its 00 condition as shown in columns 0 and 1, states g–j, of FIG. 4.

When the fourth GATED C CLOCK pulse on line 32 occurs, it causes the inverter 66 to provide a 0 signal on its output line 68, and the AND circuit 64 is therefore enabled to provide a DOUBLE GATED C CLOCK pulse on its output line 70. These DOUBLE GATED C CLOCK pulses on line 70 control counter segment 1 including SRL-1 and SRL-0 in the same way that the GATED C CLOCK pulses on line 32 control counter segment 2 and SRL-3 and SRL-2. Therefore, on this fourth GATED C CLOCK pulse in effect transmitted from the GATED C CLOCK line 32 through the AND circuit 64, latch L1b of SRL-1 is set. The counter segment 1 and the SRL-1 and SRL-0 function is exactly the same way as the counter segment 2 and its SRL-3 and SRL-2 and therefore no further detailed description of the operation in normal mode of counter segment 1 will be given.

As previously mentioned, the AND circuit 56 is not satisfied at this time, and the inverter 60 thus provides a 1 output signal on its line 62 connected to the R terminal of latch L1c. Thus, on the fourth GATED C CLOCK pulse on line 32, the latch L1c is reset and the signal c' on the output terminal of this latch goes to 0. At this time, the latch L2c remains in its set condition so that the signal c on its output line 46 is a 1. The fourth B CLOCK pulse on line 50 gates the 0 signal c into the latch Lc, and the latch L2c is reset. This same B CLOCK pulse incidentally also gates a b' signal of a 1 into and through the latch L2b so that the signal on the terminal Y is a 1. Thus, the counter of FIGS. 1A–1E is now in its k state of 0100 set forth in FIG. 4, with SRL-3 and SRL-2 being in their 0 condition, with SRL-1 being in its 1 condition, and with SRL-0 remaining in its 0 condition.

For further GATED C CLOCK pulses on line 32, counter segment 2 continues to count in the GRAY code sequence of 01, 11, 10 and 00 as just described. Counter segment 1 will also count in this same Gray code sequence of 01, 11, 10 and 00; however, counter segment 1 counts only on the existence of a DOUBLE GATED C CLOCK pulse provided by AND circuit 64 for each four of the GATED C CLOCK pulses on line 32. Therefore, SRL-0 and SRL-1 provide the most significant and next most significant bits in the count of the counter of FIGS. 1B–1E, namely those in clumns 0 and 1 of the sequence listed in FIG. 4. As is apparent from FIG. 4, counter segment 2 counts in Gray code for each GATED C CLOCK pulse on line 32 while counter segment 1 counts once for each four such pulses so that the two counter segments thus provide changes of condition of the counter of FIGS. 1B–1E from state g of 0000 to state y of 0000 for 16 GATED C CLOCK pulses on line 32.

Additional counter segments, each including a pair of SRLs may be added to those shown, either prior to SRL-3 or subsequent to SRL-0 if additional counter states are desired. The counter segments subsequent to SRL-0 will be driven by the AND circuit 64k which functions similarly to the AND circuit 64 driven by counter segment 2. A counter segment prior to those shown in FIGS. 1B to 1E will include the parts shown in FIGS. 1B and 1C including an AND circuit corresponding to the AND circuit 64 which provides a GATED C CLOCK pulse for driving SRL-3 and SRL-2.

One advantage of the disclosed counter over a straight binary counter is that using the double SRL in each segment approach eliminates most of the logic that would be required to gate successive stages in a binary counter. Only the GATED CLOCK signal on line 32 need be supplied to the successive segments as opposed to ANDing together the outputs of all previous stages as in a binary counter. Furthermore, each segment built to count Gray code comprises less logic than if it were built to count binary.

In test mode the − Test Mode signal on line 100 is made active or negative, and this signal degates AND circuits 82 and 84. Therefore, none of the outputs of oscillator 80 pass to the counter of FIGS. 1B–1E. The signals on the lines 104 and 48 can be at either level in test mode. The signals on lines 30, 28 and 108 are used and are important in test mode. The A CLOCK signal constitutes pulses which rise and fall in the same manner as the C CLOCK pulses shown in FIG. 3, and the − B CLOCK signal on line 108 constitutes pulses inverse of those for the B CLOCK pulses shown in FIG. 3.

It will be observed that the A CLOCK line 28 is connected to each of the L1d, L1c, L1b and L1a latches, and the A CLOCK pulses thus controls each of these latches. The Shift Data signal on line 30 is a signal level, and the value of this level is determined by a test program or by a previous SRL in a previous counter segment or previous logic. The Shift Data signal is a test input and will change as dictated by a test program for example. This program is for analyzing the large scale integration chip which includes the logic of FIGS. 1B–1E and any additional counter segments. The signal level on line 30 will go from 0 to 1 and vice versa in accordance with the desired pattern of tests. With the signal level on line 100 being at a 0 for starting the tests; when there is an A CLOCK pulse, this will shift the signal level on line 30 into SRL-3. This A CLOCK pulse will also shift the output of SRL-3 on terminal W into the L1c latch of SRL-2, the output of SRL-2 on terminal X into latch L1b of SRL-1 and the output of SRL-1 on terminal Y into the latch L1a of SRL-0. On the next B CLOCK pulse derived from OR circuit 90 (from line 108) the values in the latches L1d, L1c, L1b and L1a are respectively shifted into the associated latches L2d, L2c, L2b and L2a respectively. These values are then apparent on the terminals W, X, Y and Z. The pattern of succeeding bits from the counter of FIGS. 1B–1E on terminal Z may then be examined, and if the pattern is the same as the pattern of bits supplied to the Shift Data line 30, this indicates that the counter of FIGS. 1B–1E is functioning satisfactorily. (This is one example of a test and may not constitute a complete test of the counter.)

In order to reset the counter of FIGS. 1B–1E in normal mode, the + COUNTER RESET signal is applied onto the line 48. This has the effect of disabling the AND circuit 42 regardless of the signal that may be effective on the other input line 46 to the AND circuit 42, and the AND circuit 42 thus provides a 0 or inactive output on the line 34. The output of inverter 44 on the line 36 is thus active or at a 1 value, and this value is thus applied onto the reset terminal R of the latch L1d. The same conditions apply with respect to the latch as L1c, L1b and L1a—the + COUNTER RESET signal on line 48 is applied onto the AND circuits 56, 42k and 56k so as to cause the inverters 60, 44k and 60k to apply a 1 or active signal to the terminals R of the latch L1c, L1b and L1a. On a subsequent GATED C CLOCK signal on line 32 connected to the C terminals of the latches L1d and L1c, these two latches L1d and L1c are reset to provide inactive or 0 signals on their output terminals F. The GATED C CLOCK signal is inverted through inverter 66 and provides an input on line 68 to AND circuit 64. This input in conjunction with inputs on lines 24 and 58 (caused by COUNTER RESET signal on line 48) produces an output on line 70 which supplies the C CLOCK inputs to latches L1b and L1a. This C CLOCK signal resets L1b and L1a similar to L1d and L1c. Then, upon a succeeding B CLOCK pulse, the latches L2d, L2c, L2b and L2a are reset to provide inactive or 0 outputs on their output terminals H. SRL-3, SRL-2, SRL-1 and SRL-0 are thus all in reset condition. The counter of FIGS. 1B–1E therefore is at this time in reset condition.

We claim:

1. A counter for counting a series of electrical pulses comprising:
   two electrical latch assemblies, each of said latch assemblies including first and second electrical latches, each of said latches having a set and a reset state, an input element for carrying a series of input electrical pulses, circuitry connecting said input element and said first and second latches so that, on successive pulses on said input element, said first and second latches change from a reset condition on each latch to successively (a) a set condition on said first latch and a reset condition on said second latch, (b) set conditions on both of said latches, (c) a reset condition on said first latch and a set condition on said second latch, and (d) a reset condition on said two latches, and
   means responsive to the conditions of the two latches of a first one of said latch assemblies for gating a pulse from said input element of said first latch assembly to the input element of a second one of said latch assemblies only when said first latch of said first latch assembly is in reset condition and said second latch of said first latch assembly is in set condition.

2. A counter as set forth in claim 1, each of said latch assemblies having an output terminal and providing a raised signal on its output terminal when in set condition.

3. A counter as set forth in claim 1, said second latch of each of said latch assemblies having an input circuit responsive to the output of said first latch of this latch assembly and said first latch of this latch assembly having an input circuit responsive to the output of said second latch of this latch assembly so that this latch assembly successively has said (a), (b), (c) and (d) latch conditions.

4. A counter as set forth in claim 3, each of said input circuits constituting an AND circuit.

5. A counter as set forth in claim 3, said means responsive to the conditions of the two latches of said first one of said latch assemblies including an AND circuit having a first input connected to said input element of said first latch assembly, a second input connected to said input circuit for said first latch of said first latch assembly and a third input connected to said input circuit for said second latch of said first latch assembly.

6. A counter as set forth in claim 3, each of said latches having a set and a reset input terminal and being responsive to one of said input pulses to respectively set and reset the latch on the next succeeding electrical pulse after a set or reset signal is applied onto the set or reset terminal, said input circuits for said latches being connected to said set and reset terminals for toggling inputs to said set and reset terminals of the latch.

7. A counter as set forth in claim 6, each of said input circuits to each of said latches including an AND circuit having its output connected to said set terminal of the associated latch and to an inverter which has its output connected to said reset terminal of the associated latch.

8. A counter for counting a series of electrical pulses comprising:

two memory assemblies, each of said assemblies including first and second memory devices, each of said memory devices having a first state and a second different state, an input element carrying a series of input electrical pulses, circuitry for connecting said input element and said first and second memory devices so that, on successive pulses on said input element, said first and second memory devices change from a first state of each of said devices to successively (a) a said second state of said first memory device and a first state of said second memory device, (b) second states of both of said memory devices, (c) a said first state of said first memory device and a said second state of said second memory device, and (d) a said first state of both of said memory devices, and means responsive to the conditions of the two memory devices of a first one of said memory assemblies for gating a pulse from said input element of said first memory assembly to the input element of a second one of said memory assemblies only when said first memory device of said first memory assembly is in its said first state and said second memory device of said first memory assembly is in its said second state.

* * * * *